(12) United States Patent
Nakata

(10) Patent No.: US 8,606,202 B2
(45) Date of Patent: Dec. 10, 2013

(54) RADIO RECEIVER APPARATUS

(75) Inventor: Kazuhiro Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/639,431

(22) PCT Filed: Aug. 24, 2010

(86) PCT No.: PCT/JP2010/005208
§ 371 (c)(1),
(2), (4) Date: Oct. 4, 2012

(87) PCT Pub. No.: WO2012/025953
PCT Pub. Date: Mar. 1, 2012

(65) Prior Publication Data
US 2013/0029621 A1    Jan. 31, 2013

(51) Int. Cl.
*H04B 1/18* (2006.01)
(52) U.S. Cl.
USPC .................................. 455/161.3; 455/175.1
(58) Field of Classification Search
USPC .......... 455/150.1, 161.1, 161.3, 166.1, 175.1, 455/179.1
See application file for complete search history.

(56) References Cited

U.S. PATENT DOCUMENTS

| 4,264,976 | A  | * | 4/1981  | Yamashita | 455/161.2 |
| 4,661,995 | A  | * | 4/1987  | Kashiwagi | 455/183.2 |
| 5,428,833 | A  | * | 6/1995  | Reitberger et al. | 455/304 |
| 7,123,892 | B2 | * | 10/2006 | Li et al. | 455/142 |

FOREIGN PATENT DOCUMENTS

| CA | 2100447 A1     | 8/1992 |
| JP | 5-206737 A     | 8/1993 |
| JP | 6-140854 A     | 5/1994 |
| JP | 2003-283302 A  | 10/2003 |
| JP | 2008-109256 A  | 5/2008 |

* cited by examiner

*Primary Examiner* — Quochien B Vuong
(74) *Attorney, Agent, or Firm* — Birch, Stewart, Kolasch & Birch, LLP

(57) ABSTRACT

A radio receiver apparatus calculates all frequencies to be estimated as spurious frequencies in the reception frequency band by performing addition and subtraction operations on frequencies of repeated combinations formed from frequencies of a plurality of intensive electric field station, and controls the spurious frequency not to be preset to the radio receiver apparatus even though signal intensity of a received signal having the spurious frequency exceeds a predetermined threshold.

6 Claims, 3 Drawing Sheets

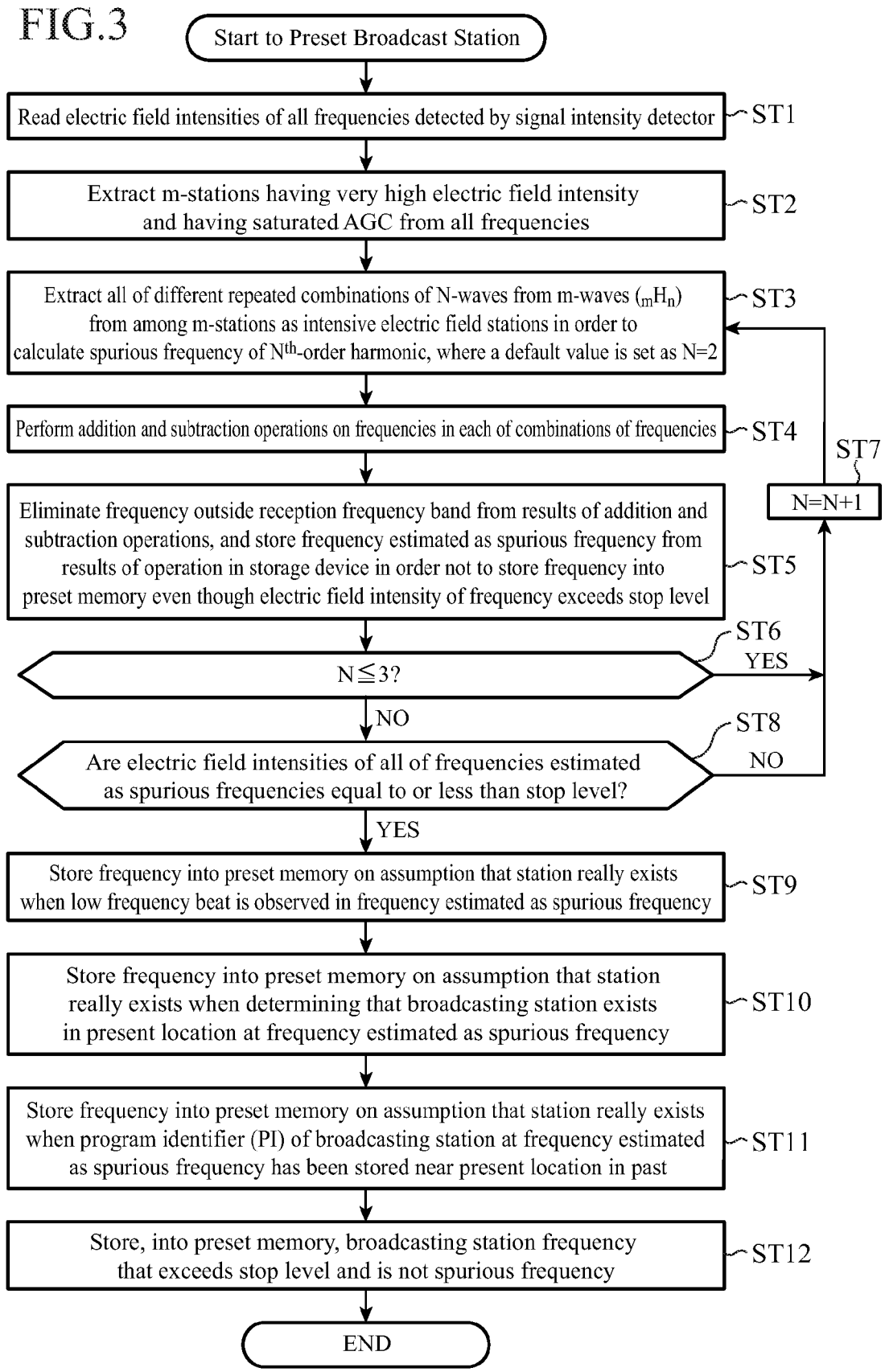

RADIO RECEIVER APPARATUS

TECHNICAL FIELD

The present invention relates to a radio receiver apparatus which presets a frequency of an available station that has been sought and received in a frequency band of AM or FM broadcast waves.

BACKGROUND ART

Patent Literature 1 describes a broadcast receiver apparatus having a seek function to seek and receive a frequency in a frequency band of AM broadcast waves and to stop the seeking operation when the sought and received frequency is available. The broadcast receiver apparatus prevents the seeking operation from improperly stopping (i.e. stopping by error) caused by storing a spurious frequency of an intensive or middle electric field region into a preset memory. The spurious frequency is formed from multiple frequencies of the received frequency of the broadcast station or from the sum and difference frequencies of a plurality of stations. When there are a plurality of intensive electric field stations of which received electric field intensity exceed a predetermined value, the second-order harmonic, the limited third-order and fourth-order harmonics spurious frequencies are empirically calculated through the sum and difference operations on the intensive electric field received frequencies so that the calculated spurious frequencies are controlled not to be stored in the preset memory.

CITATION LIST

Patent Literature

Patent Literature 1 Japanese Patent Application Laid-Open No. 2003-283302

SUMMARY OF THE INVENTION

A conventional apparatus typified by Patent Literature 1 is able to estimate the spurious frequencies through the sum and difference operations on frequencies received from two intensive electric field stations or multiple frequencies thereof. However, there is a problem in that all of the spurious frequencies assumed from the number of intensive electric field stations and frequencies thereof cannot be calculated because the sum and difference operations are performed in an empirical manner.

In light of the above-mentioned problem, the present invention is aimed to acquire a radio receiver apparatus which is capable of preventing the spurious frequencies from being preset to the radio receiver apparatus by means of calculating all of the spurious frequencies assumed from a plurality of intensive electric field stations and frequencies thereof.

The radio receiver apparatus according to the present invention seeks and receives, within a reception frequency band, a signal from a broadcast station corresponding to a broadcast wave having signal intensity greater than a predetermined threshold, and presets to the radio receiver apparatus a frequency of the sought and received signal as a frequency of a broadcast station to be received. This radio receiver apparatus includes an intensive input determination unit configured to determine an intensive electric field station in the reception frequency band of broadcast wave; and a spurious station calculation/determination unit configured to calculate, when m-stations (m is an integer number equal to or more than 2) as the intensive electric field stations are determined by the intensive input determination unit, repeated combinations with respect to N-frequencies (N is an integer number equal to or more than 2) from m-frequencies utilized in the m-stations, perform addition and subtraction operations on frequencies of each of the repeated combinations, find a frequency as a spurious frequency of Nth-order harmonics from among the frequencies acquired through the addition and subtraction operations, the frequency to be found being included in the reception frequency band, and control the spurious frequency of Nth-order harmonics not to be preset to the radio receiver apparatus even though signal intensity of a received signal having said spurious frequency of Nth-order harmonics exceeds the predetermined threshold.

According to the present invention, the radio receiver apparatus calculates all frequencies to be estimated as spurious frequencies in the reception frequency band by implementing addition and subtraction operations on frequencies of repeated combinations formed from frequencies of said plurality of intensive electric field station, and controls the spurious frequency not to be preset to the radio receiver apparatus even though signal intensity of a received signal having said spurious frequency exceeds the predetermined threshold.

Therefore, the present invention brings an advantage of preventing a spurious frequency from being preset to the radio receiver apparatus because all of the spurious frequencies estimated from the frequencies of the plurality of intensity electric field stations can be calculated by using the repeated combinations of the broadcast station frequencies of the plurality of intensity electric field stations.

BRIEF DESCRIPTION OF THE DRAWINGS

FIG. 3 is a flowchart for showing operations implemented by the vehicle-mounted radio receiver apparatus shown in FIG. 1.

DESCRIPTION OF EMBODIMENTS

In order to explain the present invention in detail, an embodiment of the present invention will be described below in accordance with the appended drawings.

EMBODIMENT 1

Figure 1:
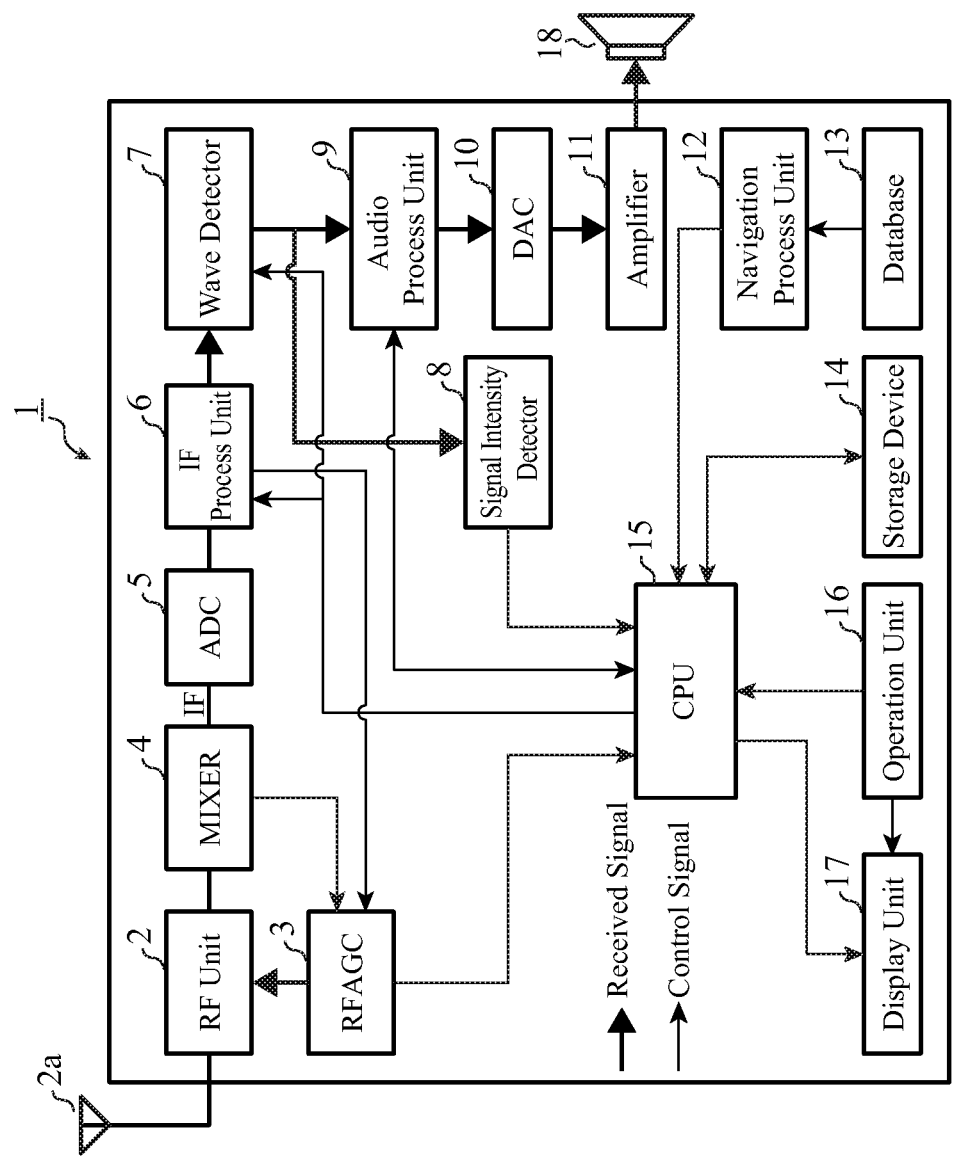
FIG. 1 is a block diagram for showing a structure of a vehicle-mounted radio receiver apparatus to which a radio receiver apparatus according to Embodiment 1 of the present invention is applied.

FIG. 1 is a block diagram for showing the structure of a vehicle-mounted radio receiver apparatus to which a radio receiver apparatus according to Embodiment 1 of the present invention is applied. In FIG. 1, a vehicle-mounted radio receiver apparatus 1 is equipped with a radio antenna 2a, an RF unit 2, an RF auto gain control (RFAGC) 3, a mixer circuit (MIXER) 4, an analog-digital converter (ADC) 5, an IF process unit 6, a wave detector 7, a signal intensity detector 8, an audio process unit 9, a digital-analog converter (DAC) 10, an amplifier 11, a navigation process unit 12, a database 13, a storage device 14, a CPU 15, an operation unit 16, a display unit 17, and a speaker 18.

The RF unit 2 performs a high-frequency amplification of RF signal of AM or FM broadcast received through the radio antenna 2a. The mixer circuit (MIXER) 4 generates an intermediate frequency (IF) signal by mixing the signal amplified by the RF unit 2 and an output signal (i.e. a local oscillation frequency signal) of a local oscillation circuit (not shown in FIG. 1). The RFAGC 3 automatically control the RF signal to keep in a constant level in accordance with the level of the received RF signal. When level of the received RF signal exceeds a predetermined range, the RFAGC 3 attenuates the level of this RF signal.

The AD converter 5 performs a sampling operation on the IF signal from the mixer circuit 4 as a front end, and converts the sampled signals into digital signals. The IF process unit 6 performs an operation, such as a restriction of a frequency band of IF signal, on the IF signal from the ADC. The wave detector 7 detects the IF signal from the IF process unit 6 to output the modulated signal. In other words, the wave detector 7 detects an audio signal and a signal intensity thereof from the output signal of the IF process unit 6. The signal intensity detector 8 measures the signal intensity of the output from the wave detector 7. The audio process unit 9 performs operations, such as adjustment of volume and a control of tone, on the audio signal detected by the wave detector 7.

The DAC 10 converts the digital signal output from the audio process unit 9 into an analog signal. The amplifier 11 amplifies power of the analog signal from the DAC 10 to enable the speaker 18 to output audio sounds. The navigation process unit 12 acquires position information on a vehicle, which is equipped with the vehicle-mounted radio receiver apparatus, by using a signal detected by a position detecting unit (not shown in the drawings) and map data stored in the database 13. The database 13 stores data such as the map data which are necessary for a navigation process. The storage device 14 comprises a program identifier (PI) code storage region, a preset memory region and a preset-protect frequency storage region. The PI code storage region stores PI code of a broadcast station received in the past. The preset memory region stores a frequency of a broadcast station which was sought by the vehicle-mounted radio receiver apparatus. The preset-protect frequency storage region stores a frequency estimated as a spurious frequency.

The CPU 15 controls the components in the vehicle-mounted radio receiver apparatus 1. The CPU 15 calculates all of the spurious frequencies estimated from frequencies of a plurality of intensive electric field stations ("intensive input stations") within a reception frequency band, and thereby prevents the seeking operation from being improperly stopped due to a determination of the spurious frequency. The spurious frequency indicates a frequency on which interference has occurred due to frequencies of signals from the intensive electric field stations. The CPU 15 controls the components in the vehicle-mounted radio receiver apparatus 1 to stop the seeking operation when determining that the sought and received frequency within the reception frequency band is available, and then store the received frequency in the preset memory region of the storage device 14.

The operation unit 16 is a component for receiving the external operation. The operation unit 16 transmits an operation mode set by a user to the CPU 15. The display unit 17 displays data generated by the CPU 15 on a screen. The speaker 18 outputs the radio signal amplified by the amplifier 11 as audio sound.

Figure 2:
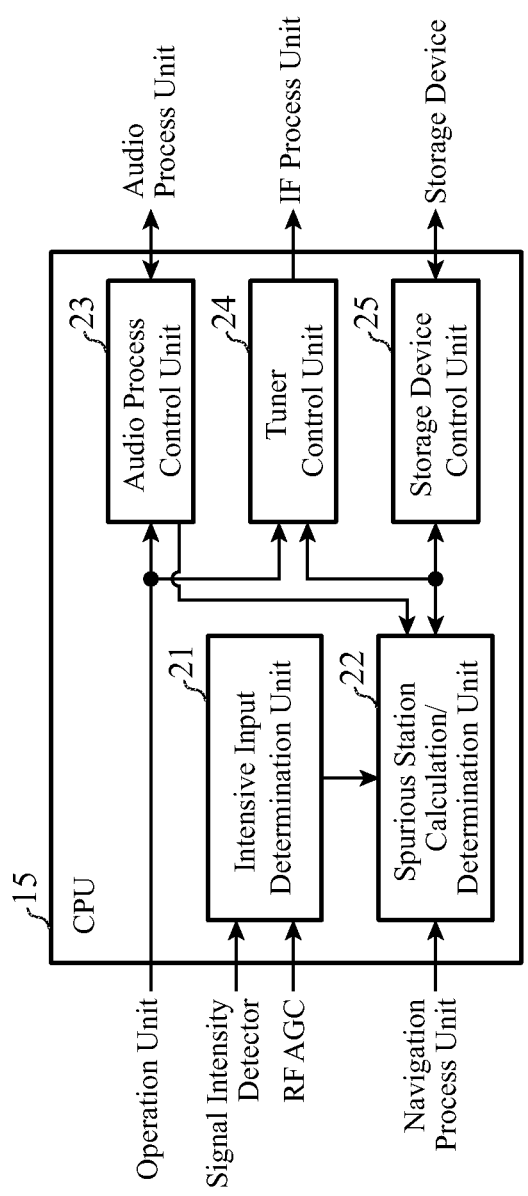
FIG. 2 is a block diagram for showing a functional structure of the CPU shown in FIG. 1.

FIG. 2 is a block diagram for showing a functional structure of the CPU in FIG. 1. An intensive input determination unit 21, a spurious station calculation/determination unit 22, an audio process control unit 23, a tuner control unit 24, and a storage device control unit 25, depicted in FIG. 2, are embodied as the specific units which are achieved through a cooperative work of software and hardware by implementing control programs corresponding to the present invention on the CPU 15.

The intensive input determination unit 21 is a component for determining an intensive electric field station ("intensive input station") within the reception frequency band. Specifically, the intensive input determination unit 21 determines the broadcast station as an intensive electric field station, whose signal intensity of the signal detected by the signal intensity detector 8 is very high enough to exceed a predetermined threshold, and whose saturated gain has been recognized by the RFAGC 3. Note that, although AGC shown in FIG. 1 is provided in RF stage, AGC can be further provided in IF stage to determine the intensive electric field station whose saturated gain has been recognized by both IFAGC and the RFAGC.

The spurious station calculation/determination unit 22 is a component for calculating, from among the broadcast station frequencies of m-stations ("m" is a natural number), a frequency estimated as the spurious frequency included in the reception frequency band. The m-stations have been determined as intensive electric field stations by the intensive input determination unit 21.

Specifically the spurious station calculation/determination unit 22 calculates repeated combinations of broadcasting frequencies by using frequencies of the m-stations determined as intensive electric field stations. Those frequencies being utilized for calculating the repeated combinations are capable of constituting Nth-order harmonic ("N" is a natural number equal to or more than two). Then the spurious station calculation/determination unit 22 performs addition and subtraction operations on the frequencies of the repeated combinations to calculate a frequency estimated as the spurious frequency.

The spurious station calculation/determination unit 22 determines PI code that has the most number of alternative stations by counting, by using the position information of the vehicle acquired by the navigation process unit 12, broadcast stations having the same PI code in an area where the vehicle is currently traveling.

Furthermore, the spurious station calculation/determination unit 22 controls the tuner control unit 24 to seek and receive a station capable of being received within the reception frequency band. When the sought and received frequency is available, the seeking operation is stopped and the received broadcast station frequency is stored in the preset memory region of the storage device 14 through the storage device control unit 25.

The audio process control unit 23 controls the audio process unit 9 in accordance with an operation on the operation unit 16 to, for instance, adjust the sound quality and volume. The tuner control unit 24 controls the IF process unit 6 and the wave detector 7 in accordance with an operation on the operation unit 16 to select a broadcast station. The storage device control unit 25 stores, in the storage device 14, the PI code of the broadcast station relating to the position of the vehicle determined by the spurious station calculation/determination unit 22, the frequency determined as available through the seeking and receiving operation, and the frequency estimated as the spurious frequency.

Next, the operations of will be described.

FIG. 3 is a flowchart for showing operations by the vehicle-mounted radio receiver apparatus 1. FIG. 3 describes the detailed process for eliminating a spurious frequency in order to preset only a frequency of the available station of FM broadcast waves.

When an auto preset mode is activated by an operation through the operation unit 16, the intensive input determination unit 21 of the CPU 15 reads out signal intensities (or signal levels) of the received signals with respect to all frequencies in the reception frequency band (step ST1). Each of the signal intensities has been detected by the signal intensity detector 8.

The intensive input determination unit 21 determines m-broadcast stations as the intensive electric field stations in all frequency of the reception frequency band read out in the step ST1 (step ST2). Each of the determined m-broadcast stations corresponds to the received signal having very high intensities equal to or more than a predetermined threshold, and corresponds to a saturated gain which is controlled by AGC 3.

The spurious station calculation/determination unit 22 calculates frequencies estimated as the spurious frequencies of Nth-order harmonics among the frequencies of the m-stations extracted by the intensive input determination unit 21. In order to this calculation, the spurious station calculation/determination unit 22 extracts all of different repeated combinations with respect to N-waves from m-waves (i.e. "$_mH_N$") (step ST3). At that time, a default value is set as "N=2". For an example of the repeated combination, if assuming that $\alpha$, $\beta$, and $\gamma$ (Hz) are observed in three intensive electric field stations (m=3), frequencies of N=2, namely, frequencies of IM2 component (i.e. a distortion component due to the second-order harmonic of a non-linear device) have six different repeated combinations ($_3H_2 =_4C_2$) of ($\alpha$, $\alpha$), ($\beta$, $\beta$), ($\gamma$, $\gamma$), ($\alpha$, $\beta$), ($\beta$, $\gamma$), and ($\gamma$, $\alpha$).

Subsequently, the spurious station calculation/determination unit 22 performs the addition and subtraction operations on the frequencies of each combinations found in the step ST3 (step ST4).

For example, in the above-mentioned repeated combinations, the following are found by calculating the addition and subtraction operations on the combinations in consideration of all combinations including both positive/negative signs.

$-2\alpha, -\alpha+\alpha=0, \alpha-\alpha=0, 2\alpha$ $-2\beta, -\beta+\beta=0, \beta-\beta=0, 2\beta$ $-2\gamma, -\gamma+\gamma=0, \gamma-\gamma=0, 2\gamma$ $-\alpha-\beta, \alpha-\beta, -\alpha+\beta, \alpha+\beta$ $-\beta-\gamma, \beta-\gamma, -\beta+\gamma, \beta+\gamma$ $-\gamma-\alpha, \gamma-\alpha, -\gamma+\alpha, \gamma+\alpha$ Note that the combination which indicates a negative number or zero should be omitted. Therefore, if assuming that the numerical relationship among the frequencies $\alpha$, $\beta$, and $\gamma$ indicates "$\alpha<\beta<\gamma$", the following frequencies of the combinations are estimated as the spurious frequencies:

$2\alpha, \beta-\alpha, \alpha+\beta, 2\beta, \gamma-\beta, \gamma+\beta, 2\gamma, \gamma-\alpha, \gamma+\alpha$ The spurious station calculation/determination unit 22 notifies the storage device control unit 25 of a frequency included in the reception frequency band to be a preset target, from among the frequencies calculated by the step ST4. The storage device control unit 25 stores, into the preset-protect frequency storage region of the storage device 14, the frequencies notified by the spurious station calculation/determination unit 22 as frequencies estimated as the spurious frequencies. The processes so far correspond to a step ST5. Thus, even though the measured signal intensity of the frequency stored in the preset-protect frequency storage region of the storage device 14 exceeds the signal intensity at which the seeking operation is stopped (i.e. exceeding a stop level), the signal intensity of the frequency stored in the preset-protect frequency storage region is not stored in the preset memory region of the storage device 14.

In step ST6, the spurious station calculation/determination unit 22 determines whether the N is equal to or less than "3". When the N is equal to or less than "3" (YES in step ST6), the process goes to step ST7. After the N is incremented by "1" in the step ST7, the process goes back to the step ST3 to repeat the processes from the step ST3 to the step ST5 until reaching N=4. By these processes, following the repeated combinations estimated as the second-order harmonic spurious frequencies that can be generated in the broadcast station frequencies of the m-waves, the different repeated combinations ($_mH_3$) estimated as the third-order harmonic spurious frequencies and the different repeated combinations ($_mH_4$) estimated as the fourth-order harmonic spurious frequencies are calculated. The frequencies included in the reception frequency band from among the calculated frequencies are stored in the preset-protect frequency storage region of the storage device 14.

When the N is not equal to or less than "3" (NO in step ST6), the spurious station calculation/determination unit 22 determines whether all of the measured electric field intensities of the frequencies estimated as the spurious frequencies and stored in the storage device 14 are equal to or less than the stop level (step ST8).

Specifically, the spurious station calculation/determination unit 22 reads out the frequency stored in the preset-protect frequency storage region of the storage device 14 through the storage device control unit 25, and instructs the tuner control unit 24 to select a broadcast station of the read frequency. The spurious station calculation/determination unit 22 acquires, from the intensive input determination unit 21, a result of comparison between the signal intensity measured by the signal intensity detector 8 at the selected frequency and the stop level, and then performs the above-mentioned determination based on the acquired result of comparison.

When any of the electric field intensities of the frequencies estimated as spurious frequencies and stored in the storage device 14 is not equal to or less than the stop level (NO in step ST8), the spurious station calculation/determination unit 22 determines that the reception status is affected by a fifth-order or more harmonic spurious frequency. Then, the process goes back to the step ST7 to perform the processes from the step ST3 to the step ST5. By these processes, the different repeated combinations ($_mH_5$) of the frequencies estimated as the fifth-order harmonic spurious frequencies are calculated. The frequencies included in the reception frequency band from among the calculated frequencies are stored in the preset-protect frequency storage region of the storage device 14.

After that, until all of the electric field intensities of the frequencies estimated as spurious frequencies stored in the preset-protect frequency storage region of the storage device 14 reach equal to or less than the stop level, the processes from the step ST3 to the step ST5 are repeated to calculate each of the different repeated combinations ($_mH_N$, N=6, 7, 8, . . . , n) of the frequencies estimated as the nth-order harmonic spurious frequencies. The frequencies included in the reception frequency band from among the frequencies of the repeated combinations are stored in the preset-protect frequency storage region of the storage device 14.

When all of the electric field intensities of the frequencies estimated as spurious frequencies are equal to or less than the stop level (YES in step ST8), a frequency where a low frequency beat is observed among the frequencies estimated as the spurious frequencies stored in the preset-protect frequency storage region of the storage device 14 is concluded as the frequency of a substantial station which substantially exists. The frequency of the substantial station is stored in the preset memory (step ST9).

In other words, the spurious station calculation/determination unit 22 instructs the tuner control unit 24 to sequentially read the frequencies stored in the preset-protect frequency storage region of the storage device 14 through the storage device control unit 25 and to select stations of the read frequencies. The spurious station calculation/determination unit 22 acquires, through the audio process control unit 23, a result of determination by the audio process unit 9 of whether the selected frequencies include the low frequency beat. Then the spurious station calculation/determination unit 22 determines, based on the determination on low frequency beat, whether the frequency is the broadcast station frequency of the substantial station.

When it is determined that there is a broadcast station at the frequency estimated as a spurious frequency, the frequency is concluded as the broadcast station frequency of a substantial station and is preset and stored (step ST10). Specifically, when the navigation process unit 12 acquires information, as area information (e.g. information on a traveling area of a vehicle), that includes the frequency of the broadcast station in the area, the spurious station calculation/determination unit 22 acquires the area information from the navigation process unit 12 to compare the frequency of the broadcast station in the area with the frequencies stored in the preset-protect frequency storage region of the storage device 14. When the frequency of the broadcast station in the area corresponds to one of the stored frequencies, the frequency is concluded as the broadcast station frequency of the substantial station.

When the frequency is estimated as the spurious frequency and the PI code of the broadcast station has been stored in the PI code storage region of the storage device 14 in the past, the frequency is concluded as the broadcast station frequency of a substantial station and is stored in the preset memory (step ST11). Specifically, the spurious station calculation/determination unit 22 reads out, through the storage device control unit 25, the frequency estimated as the spurious frequency and the PI code of the broadcast station stored at that area in the past. The frequency and the PI code are stored in the storage device 14. When the broadcast station frequency of the broadcast station specified with the PI code corresponds to the frequency estimated as the spurious frequency, the frequency is concluded as the broadcast station frequency of the substantial station.

When the frequency has not been determined as a spurious frequency and the measured signal intensity of the frequency has exceeded the stop level in the processes described above, the frequency is stored in the preset memory region of the storage device 14 as a broadcast station frequency (step ST12).

As described above, according to Embodiment 1, all of the frequencies estimated as spurious frequencies in the reception frequency band are calculated by performing the addition and subtraction operations on the frequencies in each of the repeated combinations of the broadcast station frequencies of the intensive electric field stations. The frequencies are controlled not to be preset even through the measured signal intensities of received signals in the calculated spurious frequencies exceed a predetermined threshold. In such a manner, by using the repeated combinations of the broadcast station frequencies of a plurality of intensive electric field stations, all of the spurious frequencies that are estimated from plurality of the intensive electric field stations and the received frequencies can be calculated. This is capable of preventing the spurious frequencies from being preset. Therefore, the spurious frequencies can definitely be eliminated from the preset list.

Furthermore, according to Embodiment 1, when the signal intensity of the signal received at the frequency estimated as a spurious frequency exceeds a predetermined threshold and a low frequency beat is observed in the received signal, the spurious station calculation/determination unit 22 concludes that a broadcast station substantially exists, and then presets that frequency. This is capable of reliably presetting the frequency corresponding to the frequency of the substantial broadcast station.

Furthermore, according to Embodiment 1, the navigation process unit 12 is configured to acquire the area information including the frequency for receiving the broadcast station in the area. When a frequency as the spurious frequency corresponds to the received frequency of the broadcast station included in the area information acquired by the navigation process unit 12 and the signal intensity of the received signal at the frequency exceeds a predetermined threshold, the spurious station calculation/determination unit 22 concludes that a broadcast station substantially exists. Then, the spurious station calculation/determination unit 22 presets the frequency. This is capable of reliably presetting the frequency corresponding to the frequency of the substantial broadcast station.

Further, according to Embodiment 1, from among the frequencies estimated as spurious frequencies, when there is a frequency at which the signal intensity of the received signal exceeds a predetermined threshold and at which the PI code of the broadcast station has been acquired in the past, the spurious station calculation/determination unit 22 presets the frequency. This is capable of reliably presetting the frequency corresponding to the frequency of the substantial broadcast station.

Note that the present invention can flexibly combine the embodiments with each other and/or can be modified within the range of the spirit of the present invention.

INDUSTRIAL APPLICABILITY

The radio receiver apparatus according to the present invention can prevent the seeking operation from improperly stopping due to a spurious frequency. Therefore, the radio receiver apparatus is preferably applied to a radio receiver apparatus mounted on a vehicle which possibly travels in an intensive electric field area.

The invention claimed is:

1. A radio receiver apparatus which seeks and receives, within a reception frequency band, a signal from a broadcast station corresponding to a broadcast wave having signal intensity greater than a predetermined threshold, and presets to the radio receiver apparatus a frequency of the sought and received signal as a frequency of a broadcast station to be received, comprising:

an intensive input determination unit configured to determine an intensive electric field station in the reception frequency band of broadcast wave; and a spurious station calculation/determination unit configured to calculate, when m-stations (in is an integer number equal to or more than 2) as the intensive electric field stations are determined by the intensive input determination unit, repeated combinations with respect to N-frequencies (N is an integer number equal to or more than 2) from m-frequencies utilized in the m-stations, perform addition and subtraction operations on frequencies of each of the repeated combinations, find a frequency as a spurious frequency of Nth-order harmonies from among the frequencies acquired through the addition and subtraction operations, the frequency to be found being included in the reception frequency band, and control the spurious frequency of Nth-order harmonics not to be preset to the radio receiver apparatus even though signal intensity of a received signal having said spurious frequency of Nth-order harmonics exceeds the predetermined threshold.

2. The radio receiver apparatus according to claim 1, wherein the intensive input determination unit determines, as the intensive electric field station, a broadcast station corresponding to a received signal of broadcast wave having intensity greater than a predetermined threshold, the determined broadcast station corresponding to a saturated gain which is controlled by an auto gain control circuit.

3. The radio receiver apparatus according to claim 1, wherein, when the signal intensity of the received signal having the spurious frequency exceeds a predetermined threshold and a low frequency beat is observed in said received signal, the spurious station calculation/determination unit presets said spurious frequency to the radio receiver apparatus on an assumption that a plurality of broadcast station using an equivalent frequency substantially exist.

4. The radio receiver apparatus according to claim 1, further comprising a navigation process unit configured to acquire area information including a reception frequency of a broadcast station in an area, wherein, when the signal intensity of the received signal having the spurious frequency exceeds a predetermined threshold and said spurious frequency is equivalent to the reception frequency included in the area information acquired by the navigation process unit, the spurious station calculation/determination unit presets said spurious frequency to the radio receiver apparatus on an assumption that a broadcast station substantially exists.

5. The radio receiver apparatus according to claim 1, wherein, when the signal intensity of the received signal having the spurious frequency exceeds a predetermined threshold and a program identifier (PI) code of a broadcast station has been acquired at said spurious frequency, the spurious station calculation/determination unit presets said spurious frequency to the radio receiver apparatus.

6. The radio receiver apparatus according to claim 1, wherein the spurious station calculation/determination unit performs the calculations associated with the harmonics until a harmonic having an order where all of the measured electric field intensities of the calculated spurious frequencies are less than the predetermined threshold.

* * * * *